US012738905B2

(12) United States Patent
Yang et al.

(10) Patent No.: US 12,738,905 B2
(45) Date of Patent: Sep. 15, 2026

(54) RF CIRCUIT WITH BALANCED AMPLIFIER, RECEIVE AMPLIFIER, AND OUTPUT DIRECTIONAL COUPLER

(71) Applicant: NXP B.V., Eindhoven (NL)

(72) Inventors: Xin Yang, Eindhoven (NL); Mark Pieter van der Heijden, Eindhoven (NL); Jasper Pijl, Eindhoven (NL); Zhe Chen, Eindhoven (NL)

(73) Assignee: NXP B.V., Eindhoven (NL)

( * ) Notice: Subject to any disclaimer, the term of this patent is extended or adjusted under 35 U.S.C. 154(b) by 469 days.

(21) Appl. No.: 18/481,259

(22) Filed: Oct. 5, 2023

(65) Prior Publication Data

US 2024/0195367 A1 Jun. 13, 2024

(30) Foreign Application Priority Data

Dec. 7, 2022 (EP) .................................... 22211899

(51) Int. Cl.
*H03F 1/02* (2006.01)
*H01P 5/18* (2006.01)
*H03F 3/24* (2006.01)

(52) U.S. Cl.
CPC ................ *H03F 3/24* (2013.01); *H01P 5/18* (2013.01); *H03F 2200/451* (2013.01)

(58) Field of Classification Search
CPC .................................... H03F 1/02; H03F 1/07
USPC ............................................. 330/124 R, 295
See application file for complete search history.

(56) References Cited

U.S. PATENT DOCUMENTS 7,427,895 B1 * 9/2008 Okubo .................. H03F 1/0288 330/136
7,656,964 B1 * 2/2010 DeCoste .............. H04B 1/0466 330/149
9,369,095 B2 * 6/2016 Kobayashi ............ H03F 1/0261
10,224,184 B2 * 3/2019 Van Zyl ............ H01J 37/32146
12,015,380 B2 * 6/2024 Shepphard ............ H03F 1/0288
2019/0173435 A1 * 6/2019 Mclaren ................ H03F 1/0288

(Continued)

FOREIGN PATENT DOCUMENTS

JP S61 169031 A 7/1986
JP 2003037459 A 7/2003
WO 2020192917 A1 10/2020

OTHER PUBLICATIONS

Kurokawa: "Design Theory of Balanced Transistor Amplifiers"; The Bell System Technical Journal (vol. 44, Issue: 8, Oct. 1965); pp. 1675-1698.

(Continued)

*Primary Examiner* — Henry Choe

(57) ABSTRACT

A Radio-Frequency (RF) circuit for an RF front-end includes a balanced amplifier with first and second amplifiers and an output directional coupler. First and second ports of the output directional coupler are coupled to outputs of the first and second amplifiers, a third port of the output directional coupler is coupled to an input-output terminal that is configured to be coupled to an antenna, and a fourth port of the output directional coupler is coupled to an input of a receiver amplifier. In a transmit mode, the output directional coupler may couple an RF signal to the input-output terminal. In a receive mode, the output directional coupler may couple a signal received from an antenna to the input of the receiver amplifier.

20 Claims, 11 Drawing Sheets

300

(56) References Cited

U.S. PATENT DOCUMENTS

| | | | |
|---|---|---|---|
| 2020/0274575 | A1 | 8/2020 | Yang et al. |
| 2022/0285081 | A1 | 9/2022 | Yang et al. |

OTHER PUBLICATIONS

Frye et al.: "A 2-GHz Quadrature Hybrid Implemented in CMOS Technology"; IEEE Journal of Solid-State Circuits, vol. 38, No. 3, Mar. 2003; pp. 550-555.

Regev Dror et al.: "Modified re-configurable quadrature balanced power amplifiers for half and full duplex RF front ends", 2018 Texas Symposium on Wireless and Microwave Circuits and Systems (WMCS), IEEE, Apr. 5, 2018 (Apr. 5, 2018), pp. 1-4.

* cited by examiner

100

200

300

350

400

550

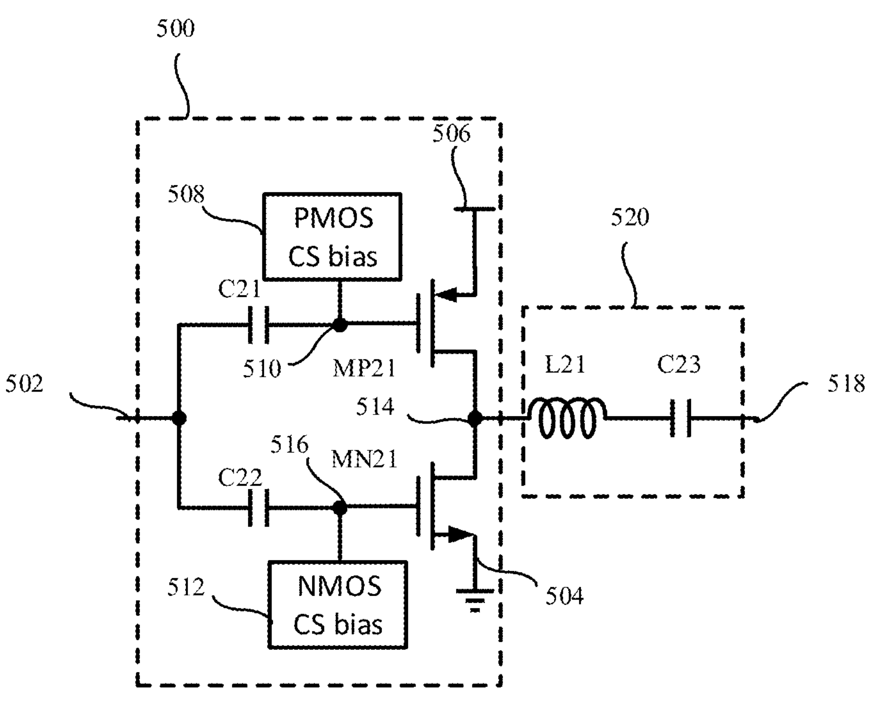
FIG. 8A
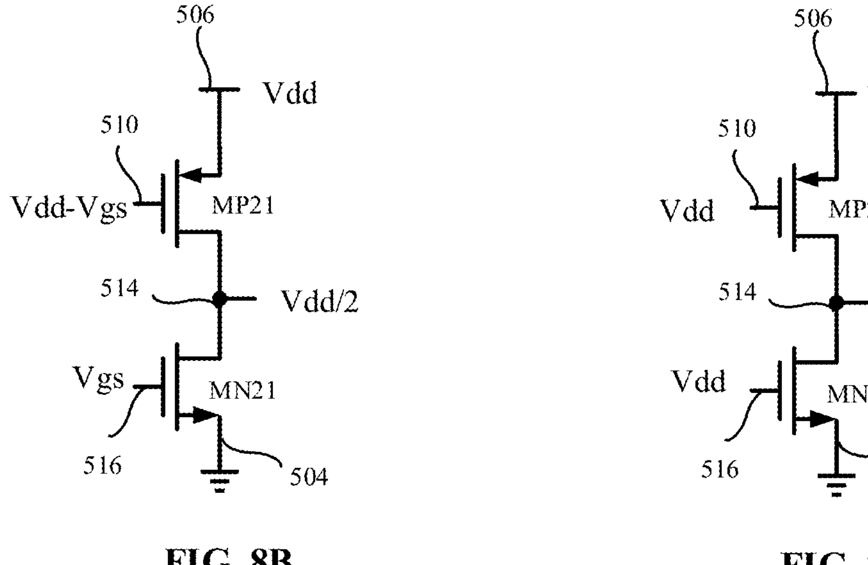
FIG. 8B
FIG. 8C

600

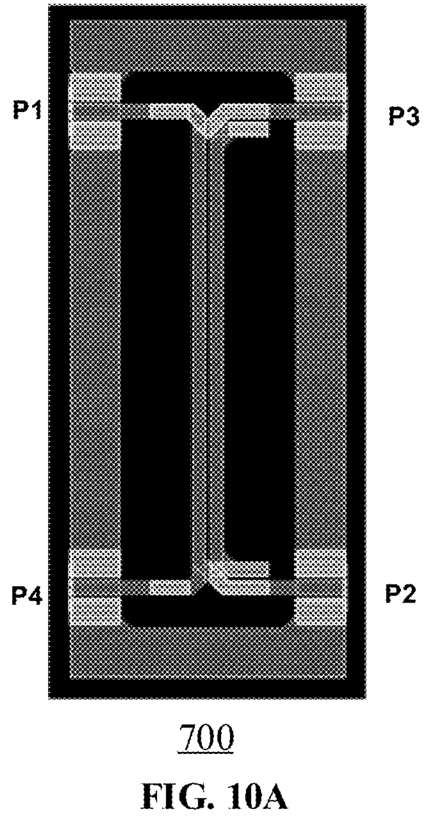
700
FIG. 10A
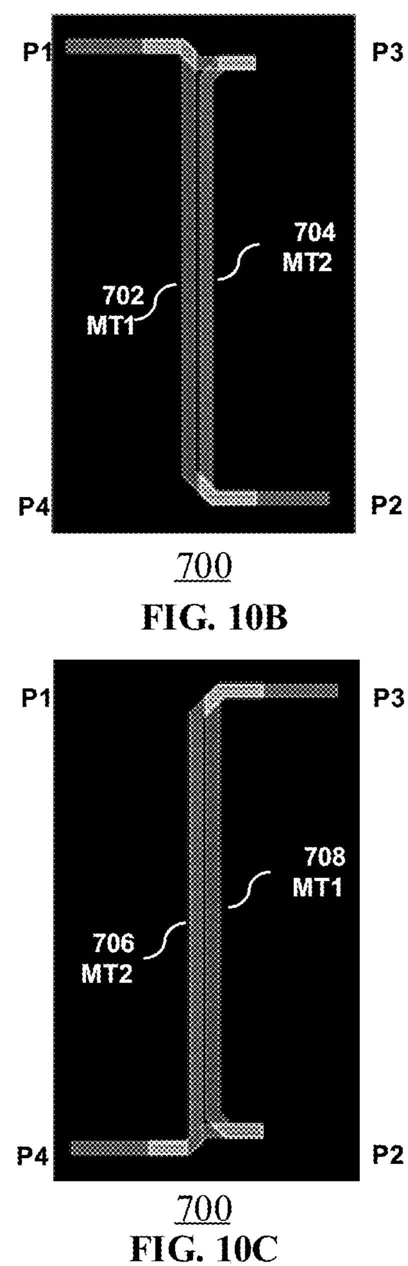
FIG. 10B
700
FIG. 10C

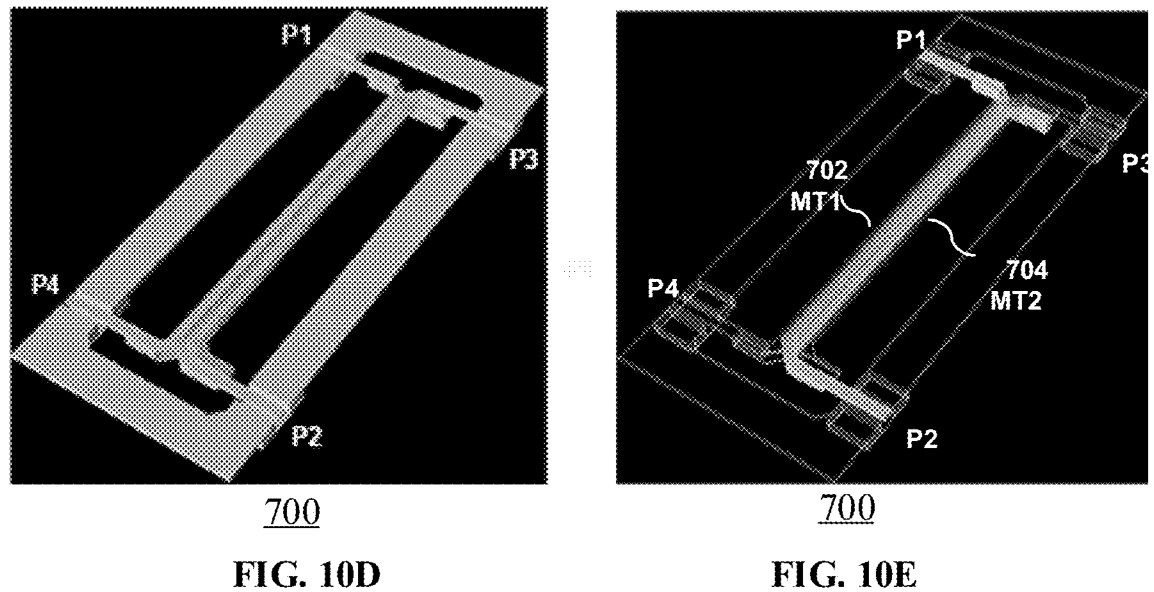
700
FIG. 10D
700
FIG. 10E
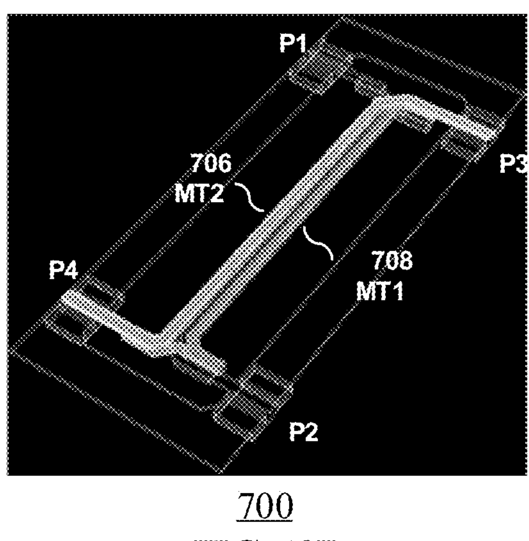
700
FIG. 10F
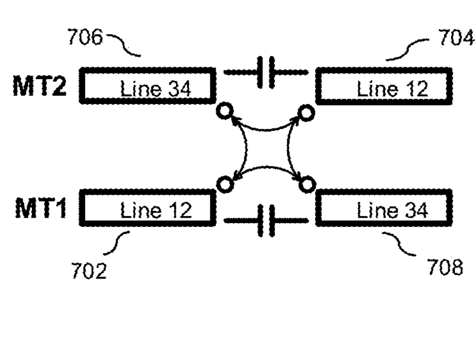
700
FIG. 10G

RF CIRCUIT WITH BALANCED AMPLIFIER, RECEIVE AMPLIFIER, AND OUTPUT DIRECTIONAL COUPLER

CROSS-REFERENCE TO RELATED APPLICATION

This application claims priority under 35 U.S.C. § 119 to European patent application no. 22211899.4, filed 7 Dec. 2023, the contents of which are incorporated by reference herein.

FIELD

This disclosure relates to a Radio-Frequency (RF) circuit for an RF front-end.

BACKGROUND

RF systems such as base stations, mobile devices, and radar typically include an RF front-end which connects a RF transceiver to one or more antennas via one or more RF switches. The RF front-end circuit may be implemented as an integrated circuit which for a time-division duplex (TDD) system requires a single pole double throw (SPDT) switch between the transmit/receive (TX/RX) channel and the antenna to switch the RF front-end circuit between the transmit (TX) and receive (RX) modes. RF front-ends including such RF switches may connect the antenna either to a low noise amplifier (LNA) in a receive mode of the transceiver so that an RF signal may be received, or to a power amplifier (PA) in a transmit mode of the transceiver so that an RF signal may be transmitted. A key performance requirement of the RF switch function is the insertion loss (IL). The insertion loss directly adds to the noise figure (NF) when the transceiver is in a receive mode which in turn may determine the sensitivity of the receiver. The RF switch IL factor also affects the power output requirement for the PA in the transmit mode of the transceiver. An increased power output requirement results in an increased PA current consumption which in turn may cause an undesired increase in the temperature of an integrated circuit including the RF front-end circuitry.

SUMMARY

Aspects of the disclosure are defined in the accompanying claims.

In a first aspect, there is provided an RF circuit for an RF front-end, the RF circuit comprising: an input-output terminal configured to be coupled to an antenna; a receiver amplifier; a balanced amplifier comprising: an input directional coupler comprising four ports; an output directional coupler comprising four ports; a first transmit amplifier; a second transmit amplifier; wherein an input of the first and second transmit amplifiers is coupled to a respective port of the input directional coupler; a first port of the output directional coupler is coupled to the input-output terminal, a second port of the output directional coupler is coupled to an output of the first transmit amplifier, a third port of the output directional coupler is coupled to an output of the second transmit amplifier and a fourth port of the output directional coupler is coupled to an input of the receiver amplifier; wherein the RF circuit is configured in a transmit mode of operation to transmit an RF signal to the input-output terminal and in a receive mode of operation to couple an RF signal received on the first port of the output directional coupler to an input of the receiver amplifier.

In one or more embodiments, the input-output terminal comprises an antenna terminal configured to be coupled to an antenna.

In one or more embodiments, the RF circuit may further comprise a power management module coupled to the first transmit amplifier and the second transmit amplifier and configured to enable the first transmit amplifier and second transmit amplifier in the transmit mode of operation and to configure the first transmit amplifier and second transmit amplifier to provide a high reflection power in the receive mode of operation.

In one or more embodiments, the balanced amplifier may further comprise a first output matching network arranged between the first transmit amplifier output and the second port of the output directional coupler, and a second output matching network arranged between the second transmit amplifier output and the third port of the output directional coupler.

In one or more embodiments, each of the first output matching network and the second output matching network may further comprise: a first inductor having a first inductor first terminal coupled to the amplifier output and a first inductor second terminal configured to be coupled to a supply voltage in the transmit mode of operation and a ground in the receive mode of operation.

In one or more embodiments, the power management module may further comprise an inverter having an inverter output coupled to each first inductor second terminal; wherein an inverter input is configured to receive a logic low control value in the transmit mode of operation and logic high control value in the receive mode of operation.

In one or more embodiments, each of the first output matching network and the second output matching network may further comprise: a series arrangement of a second inductor and a transmission line between a respective one of the first transmit amplifier output and the second transmit amplifier output, and a respective one of the second port and the third port of the output directional coupler; wherein the first inductor first terminal is coupled to a common node of the series arrangement of the second inductor and the transmission line.

In some embodiments, a first port of the input directional coupler is coupled to a balanced amplifier input, a second port of the input directional coupler is coupled to an input of the second transmit amplifier, a third port of the input directional coupler is coupled to an input of the first transmit amplifier and a fourth port of the input directional coupler is configured to be coupled to an isolation impedance.

In one or more embodiments, the RF circuit may further comprise an RF terminal and further configured in the transmit mode to switchably couple the balanced amplifier input to the RF terminal, and in the receive mode to switchably couple the output of the receiver amplifier to the RF terminal.

In some embodiments, a first port of the input directional coupler is configured to be coupled to an RF terminal of the RF circuit, a second port of the input directional coupler is coupled to an input of the second transmit amplifier, a third port of the input directional coupler is coupled to an input of the first transmit amplifier and a fourth port of the input directional coupler coupled to an output of the receiver amplifier; and wherein in the receive mode of operation, the RF circuit is further configured to couple a RF signal from the output of the receiver amplifier to the first port of the input directional coupler and in the transmit mode of operation to couple an RF signal from the RF terminal to the inputs of the first and second transmit amplifiers.

In some embodiments, in the receive mode of operation, the balanced amplifier is further configured to switchably couple the input of the first transmit amplifier and the input of the second transmit amplifier to ground; and to output a received RF signal from the RF terminal; and wherein in the transmit mode of operation, the RF circuit is configured to receive an RF signal for transmission on the RF terminal.

In some embodiments, the balanced amplifier further comprises a first interstage matching network arranged between the first transmit amplifier input and the third port of the input directional coupler and a second interstage matching network arranged between the second transmit amplifier input and the second port of the input directional coupler.

In one or more embodiments, each of the first transmit amplifier and the second transmit amplifier may further comprise: a cascode arrangement of a first bipolar transistor in a common base configuration and second bipolar transistor in a common emitter configuration, wherein the base of the second bipolar transistor is coupled to the respective amplifier input, the emitter of the second bipolar transistor is coupled to a reference voltage, the collector of the first bipolar transistor is coupled to the respective amplifier output, and the base of the first bipolar transistor is coupled to a bias circuit; and a capacitor coupled between the base of the first bipolar transistor and a ground; and wherein in the transmit mode of operation, the respective amplifier output is configured to be coupled to a supply voltage; and in the receive mode of operation, the respective amplifier output is configured to be coupled to a reference voltage and the bias circuit is configured to forward bias the base-collector junction of the first bipolar transistor.

In one or more embodiments, the bias circuit may further comprise: a gyrator including a third bipolar transistor having a collector coupled to the base of the first bipolar transistor; a first current mirror coupled to the gyrator; a second current mirror coupled to the base of the first bipolar transistor; wherein in the transmit mode of operation the first current mirror is disabled, the second current mirror is enabled and the bias circuit is configured to bias the gyrator to provide the bias current to the first bipolar transistor; and in the receive mode of operation the first current mirror is enabled, the second current mirror is disabled and configured to provide the bias current to the first bipolar transistor.

In some embodiments, the output directional coupler and the input directional coupler comprise a directional coupler comprising: a first metal layer; a second metal layer arranged above the first metal layer; wherein the first metal layer comprises: a first metal line configured to be electrically coupled to the first port of the directional coupler and the second port of the directional coupler; and a second metal line configured to be electrically coupled to the third port of the output directional coupler and the fourth port of the directional coupler; and the second metal layer comprises: a third metal line configured to be electrically coupled to the first port of the directional coupler and the second port of the directional coupler; and a fourth metal line configured to be electrically coupled to the third port of the output directional coupler and the fourth port of the directional coupler; and wherein a segment of the first metal line is parallel to the second metal line; and a segment of the third metal line is parallel to the fourth metal line.

In some embodiments, a segment of the first metal line is parallel to and directly below the fourth metal line; and a segment of the second metal line is parallel to and directly below the third metal line.

In some embodiments, the RF circuit further comprises an antenna coupled to the first port of the output directional coupler and further comprising an antenna matching network arranged between the first port of the output directional coupler and the antenna.

In some embodiments, the RF circuit further comprises a switch having a first switch terminal coupled to the RF terminal, a second switch terminal coupled to the first port of the input directional coupler and third switch terminal coupled to the receiver amplifier output, and a transmit buffer amplifier arranged between the second switch terminal and the first port of the input directional coupler; and configured to couple the receiver amplifier output to the RF terminal in the receive mode of operation and configured to couple the first port of the input directional coupler to the RF terminal in the transmit mode of operation.

In some embodiments, each of the first transmit amplifier and the second transmit amplifier further comprises a CMOS totem-pole amplifier wherein the output of the CMOS totem-pole amplifier is configured to be biased at half the supply voltage in transmit mode and at a ground voltage in receive mode.

In some embodiments, the RF circuit further comprises a bidirectional amplifier coupled between the RF terminal and the first port of the input directional coupler.

BRIEF DESCRIPTION OF THE DRAWINGS

In the figures and description like reference numerals refer to like features. Embodiments are now described in detail, by way of example only, illustrated by the accompanying drawings in which:

FIG. 8A shows an example implementation of a transmit amplifier for embodiments of the RF circuit.

FIG. 8B shows the bias condition in transmit mode for the transmit amplifier of FIG. 8A.

FIG. 8C shows the bias condition in transmit mode for the transmit amplifier of FIG. 8A.

FIGS. 10A-10G illustrate different views of a directional coupler with improved coupling according to an embodiment.

Figure 1:
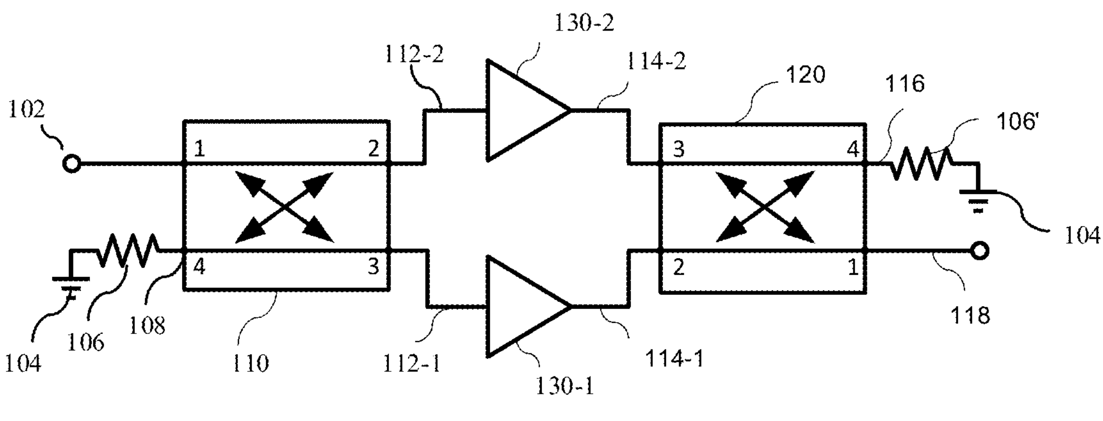
FIG. 1 shows a balanced amplifier.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

FIG. 1 shows a typical balanced amplifier 100 which may be used to implement a RF transmitter amplifier. The balanced amplifier 100 includes an input directional coupler 110, a first amplifier 130-1, a second amplifier 130-2 and an output directional coupler 120. The input directional coupler 110 and the output directional coupler 120. Each of the input directional coupler 110 and the output directional coupler 120 is implemented as a four-port element. The ports 1 to 4 are arranged in clockwise direction. Port 1 (P1) and port 2 (P2) are galvanically connected. Similarly ports 3 (P3) and 4 (P4) are galvanically connected. P1 may be referred to as an input port. P2 may be referred to as the transmitted port, P3 may be referred to as the coupled port and P4 may be referred to as the isolated port. The coupling between ports 1 and 3 is typically capacitive and/or inductive coupling.

The performance of the directional coupler may be defined using the following known equations based on S-Parameters:

$$\text{Insertion loss}=20\times\log S21 \quad (1)$$

$$\text{Coupling}=20\times\log S31 \quad (2)$$

$$\text{Isolation}=20\times\log S41 \quad (3)$$

The RF input 102 is connected to port 1 of the input directional coupler 110 with port impedance Z0 which is typically 50-Ohm. The isolation port 4 of input directional coupler 110 is terminated with an isolation resistor 106 having a first terminal 108 connected to port 4 and second terminal connected to ground 104. The isolation resistor 106 has a value of resistance R=Z0. The input signal from the RF input is split in 0° and 90° signals at the paths 112-2, 112-1 respectively to the inputs of the amplifiers 130-2, 130-1 for 0° and 90° branches, respectively. The amplifier outputs 114-1, 114-2 are connected respectively to ports 2 and 3 of the output directional coupler 120. The output directional coupler 120 combines the 0° and 90° and delivers the output signal to port 1 of the output directional coupler 120 which is connected to the RF output 118. The isolation port 4 of output directional coupler 110 is terminated with an isolation resistor 106 having a first terminal 116 connected to port 4 and second terminal connected to ground 104. The balanced amplifier 100 may give robust performance over the interface port impedance (voltage standing wave ratio, VSWR) variation. This may be especially useful in an environment where the amplifier load impedance changes as a result of static and dynamic antenna impedance variations such as in antenna arrays for 5G and 6G mobile communication. The balanced amplifier 100 may be included in a RF Front-End (RFFE) Integrated Circuit (IC).

Figure 2:
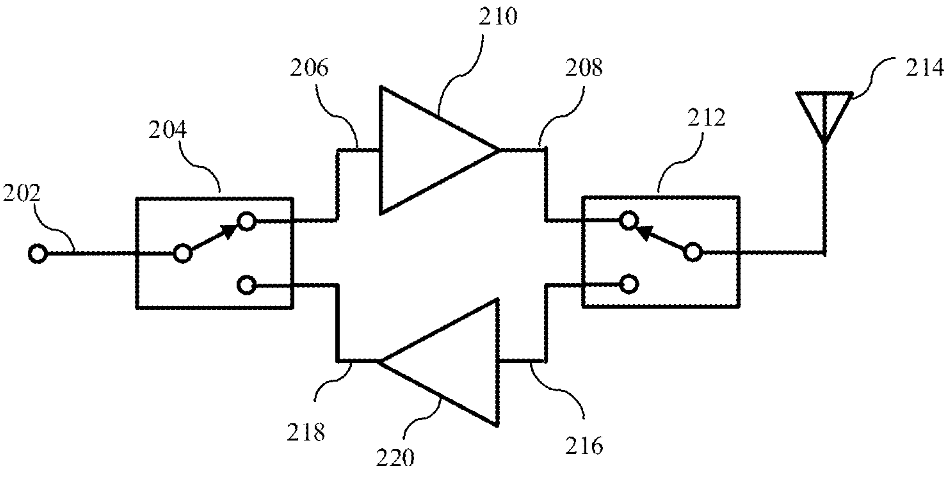
FIG. 2 illustrates a typical RF front-end circuit.

FIG. 2 shows the typical block diagram of a RF Front-End circuit 200 which may be implemented as an integrated circuit. An RF terminal 202 is connected to an input SPDT switch 204. A transmitter power amplifier 210 has a transmitter amplifier input 206 connected to the SPDT and a transmitter amplifier output 208 connected to an antenna SPDT switch 212. A receiver amplifier 220 which is typically composed of a multi-stage LNA amplifier has an input 216 connected to the antenna SPDT switch and an output 218 connected to the input SPDT switch 204. An antenna 214 is connected to the antenna SPDT switch 212.

In transmit mode, the input SPDT switch 204 connects the RF terminal 202 to the transmitter amplifier input 206, and the antenna SPDT switch 212 connects the transmitter amplifier output 208 to the antenna 214. In receive mode, the input SPDT switch 204 connects the RF terminal 202 to the receiver amplifier output 218, and the antenna SPDT switch 212 connects the receiver amplifier input 216 to the antenna 214.

Figure 3:
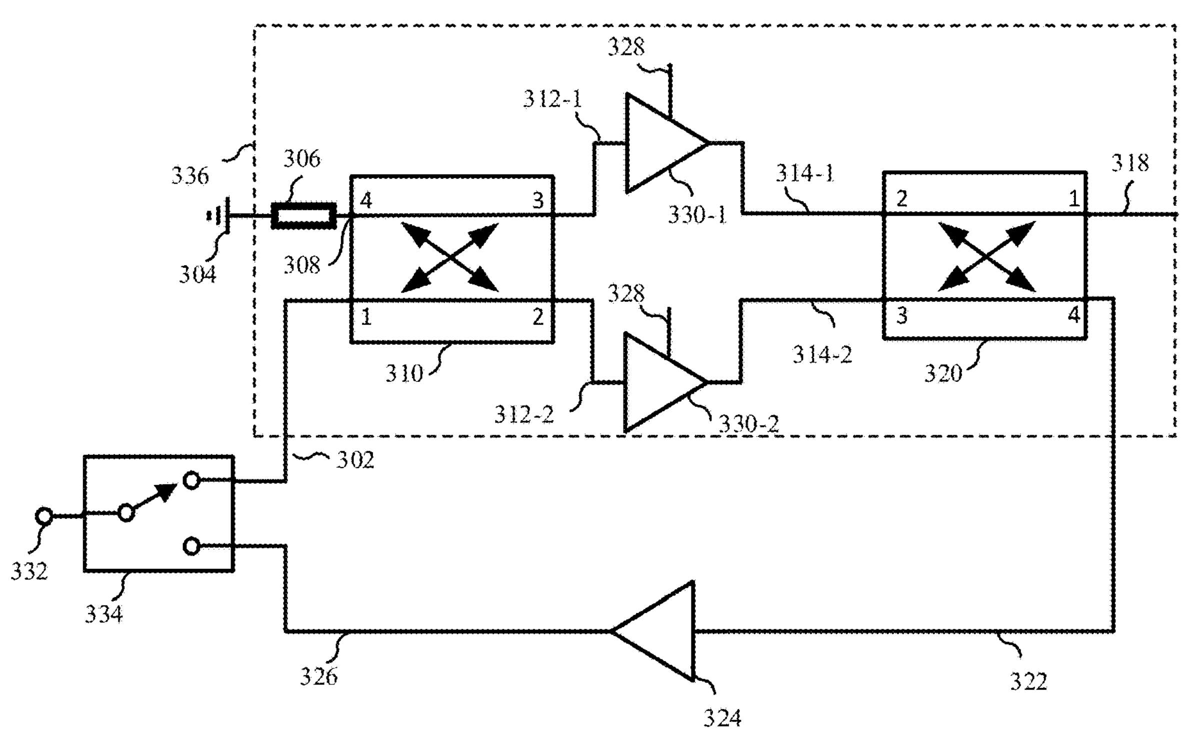
FIG. 3 shows a RF front-end circuit according to an embodiment.

FIG. 3 shows a RF front end circuit 300 according to an embodiment which may be implemented as an integrated circuit. RF front end circuit 300 includes a balanced amplifier 336 and a receiver amplifier 324. The balanced amplifier 336 includes an input directional coupler 310, a first transmit amplifier 330-1, a second transmit amplifier 330-2 and an output directional coupler 320. The first transmit amplifier 330-1 and the second transmit amplifier 330-2 may each have a control input connected to a power management output 328 provided by a power management module (not shown). Each of the input directional coupler 310 and the output directional coupler 320 may be implemented as a four-port element similarly to directional couplers 110,120.

An RF input 302 is connected to port 1 of the input directional coupler 310 with port impedance Z0 which is typically 50-Ohm. The isolation port 4 of input directional coupler 310 is terminated with an isolation impedance 306 having a first terminal 308 connected to port 4 and second terminal connected to ground 304. The isolation impedance 306 has a value of Z0. Port 3 of the input directional coupler 310 may be connected to an amplifier input 312-1 of the first transmit amplifier 330-1. Port 2 of the input directional coupler 310 may be connected to an amplifier input 312-2 of the second transmit amplifier 330-2.

The amplifier outputs 314-1, 314-2 are connected respectively to ports 2 and 3 of the output directional coupler 320. The output directional coupler 320 combines the 0° and 90° and delivers the output signal to port 1 of the output directional coupler 120 which may be connected to an antenna terminal 318. The antenna terminal 318 may be connected to an antenna (not shown). The isolation port 4 of output directional coupler 320 may be connected to a receiver amplifier input 322 of a receive amplifier 324. A receiver amplifier output 326 may be connected to an input SPDT switch 334. The RF input 302 of the transmitter may be connected to the input SPDT switch 334. An RF terminal 332 may be connected to the input SPDT switch 334.

In transmit mode, the transmit power amplifiers 330-1, 330-2 are enabled, the receiver amplifier 324 is disabled via a control input (not shown) and the input SPDT switch 334 connects the RF terminal 332 to the transmitter amplifier RF input 302. A transmit RF signal is routed via the RF terminal 332 and the RF input 302 and then split in 0° and 90° signals at the transmitter amplifier inputs 312-2, 312-1 respectively for 0° and 90° branches, respectively. The amplifier outputs 314-1, 314-2 are connected respectively to ports 2 and 3 of the output directional coupler 320. The output directional coupler 320 combines the 0° and 90° outputs from the transmitter amplifiers 330-1,330-2 and delivers the output signal to port 1 of the output directional coupler 320 which is connected to the antenna terminal 318.

In receive mode, the transmit power amplifiers 330-1, 330-2 are disabled, and receive amplifier 324 is enabled via control input (not shown) and the input SPDT switch 334 connects the RF terminal 332 to the receiver amplifier output 326, and the transmit power amplifiers 330-1,330-2 are disabled. The transmit amplifiers 330-1, 330-2 may be configured as a switch device and provide a RF-short (low-Ohmic) termination at the transmitter amplifier outputs 314-1, 314-2. This may result in a high reflection power from ports 2 and 3 of the output directional coupler 320. A high reflection power in this context may be understood to correspond to a reflection coefficient higher than 0.9. A signal received on the antenna terminal 318 may be coupled by the output directional coupler 320 to the receiver amplifier input 322 due to the high reflection at ports 2 and 3 of the output directional coupler 320. The front end circuit 300 does not require an antenna switch in contrast to front end circuit 200. Instead the output directional coupler 320 is used in both transmit and receive modes to couple the antenna to the appropriate circuitry. In some example RF front end circuits which connect to a common antenna in both transmit and receive but have separate transmit and receive paths, the RF terminal 332 and the input SPDT switch 334 may be omitted.

Figure 4:
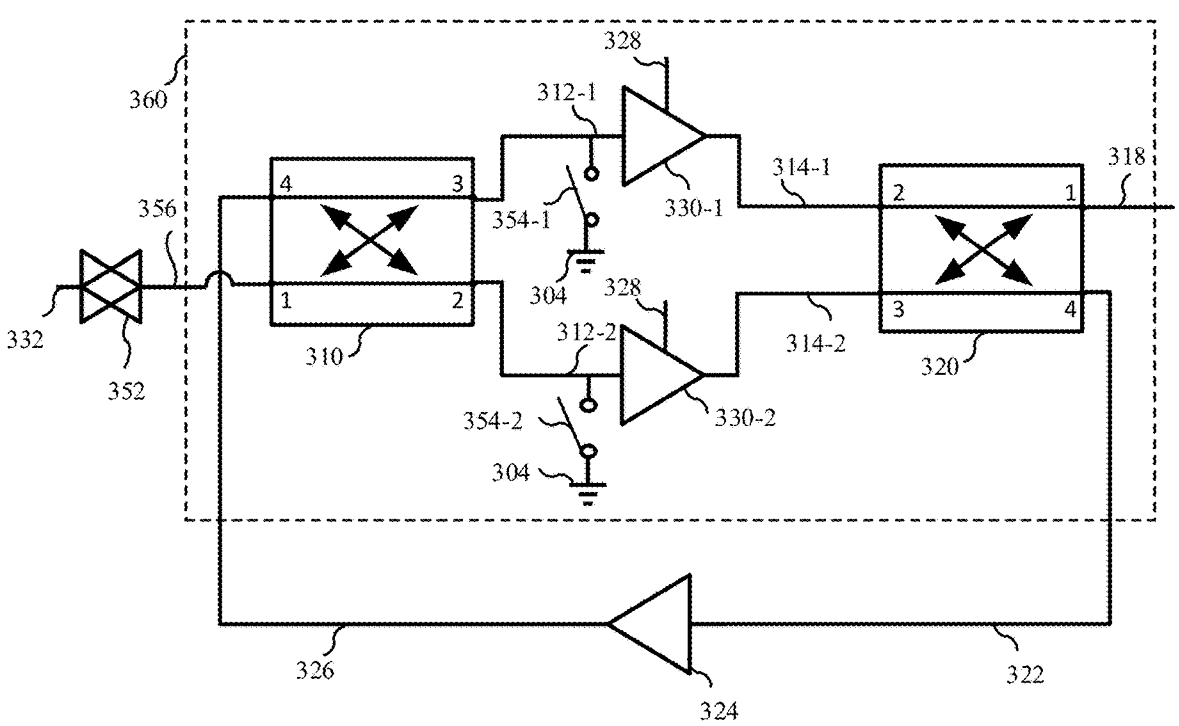
FIG. 4 shows a RF front-end circuit according to an embodiment.

FIG. 4 shows a front end circuit 350 according to an embodiment. Compared to front end circuit 300, the input SPDT switch 334 and the isolation impedance 306 is omitted and the receiver amplifier output 326 is connected to port 4 of the input directional coupler 310. A bidirectional buffer 352 may be connected between the RF terminal 332 and node 356 which is connected to port 1 of the input directional coupler 310. In some examples, bidirectional buffer 352 may be omitted. Front end circuit 350 may further include shunt switches 354-1,354-2 connected between respective transmitter amplifier inputs 312-1, 312-2 and ground 304.

In transmit mode, the transmit power amplifiers 330-1, 330-2 are enabled, and the shunt switches 354-1,354-2 are open circuit. An RF signal present on the RF terminal 332 is provided to node 356 and then split in 0° and 90° signals at the transmitter amplifier inputs 312-2, 312-1 respectively for 0° and 90° branches, respectively. The amplifier outputs 314-1, 314-2 are connected respectively to ports 2 and 3 of the output directional coupler 320. The output directional coupler 320 combines the 0° and 90° outputs from the transmitter amplifiers 330-1,330-2 and delivers the output signal to port 1 of the output directional coupler 320 which is connected to the antenna terminal 318.

In receive mode, the transmit power amplifiers 330-1, 330-2 are disabled, and the shunt switches 354-1,354-2 are closed which may effectively provide an RF short. This may increase the reflection coefficient at ports 2 and 3 of the input directional coupler 310 which may allow a signal to be coupled between ports 1 and 4 of the input directional coupler 310. In other examples, a signal received on the antenna terminal 318 may be coupled by the output directional coupler 320 to the receiver amplifier input 322 and coupled to the RF terminal 332 by the input directional coupler 310. The front end circuit 350 does not require an antenna switch or input switch in contrast to front end circuit 200. Instead the input directional coupler 310 and output directional coupler 320 is used in both transmit and receive modes to couple the antenna to the appropriate circuitry. In some examples, as well as or instead of shunt switches 354-1,354-2, similar shunt switches may be connected to the respective transmit amplifier outputs 314-1, 314-2 to enhance or replace the RF short implemented in the transmit amplifiers 330-1, 330-2 in the receive mode.

Figure 5:
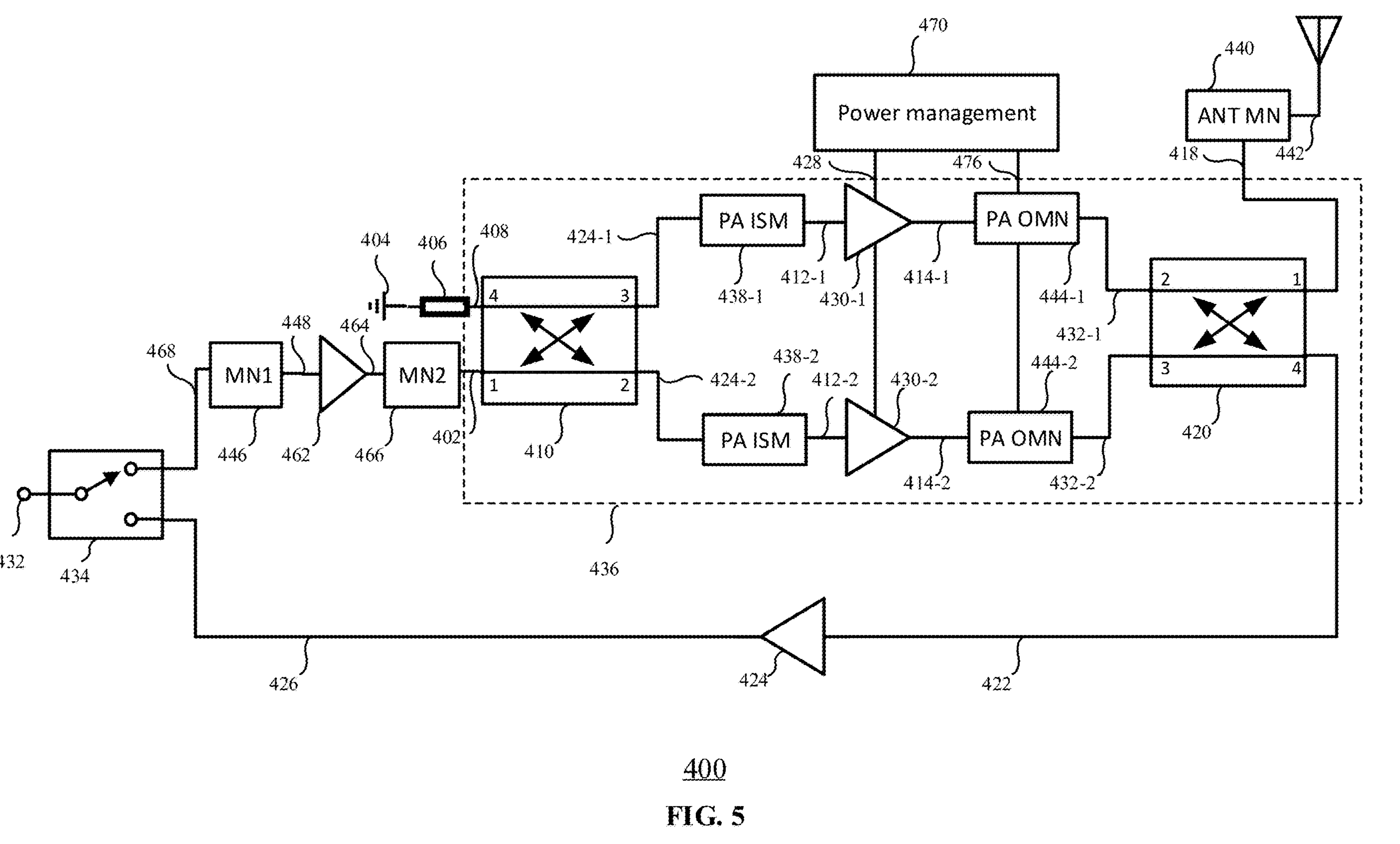
FIG. 5 shows a RF front-end circuit according to an embodiment.

FIG. 5 shows a RF front end circuit 400 according to an embodiment. RF front end circuit 400 includes a balanced amplifier 436. The balanced amplifier 436 includes an input directional coupler 410, a first interstage matching network 438-1, a second interstage matching network 438-2, a first transmit amplifier 430-1, a second transmit amplifier 430-2, a first output matching network 444-1, a second output matching network 444-2 and an output directional coupler 420. A power management module 470 may have a first power management output 428 and a second power management output 476. The first transmit amplifier 430-1 and the second transmit amplifier 430-2, may each have a control input connected to the first power management output 428. The first output matching network 444-1 and the second output matching network 444-2 may each have a control input connected to the second power management output 476. Each of the input directional coupler 410 and the output directional coupler 420 may be implemented as a four-port element similarly to directional couplers 110,120,310,320. An RF terminal 432 may be connected to an input SPDT switch 434. The input SPDT switch may be connected to an input 468 of an input stage input matching network 446. An output 448 of the input stage input matching network 446 may be connected to an input of a buffer amplifier 462. An output 464 of the buffer amplifier 462 may be connected to an input of an input stage output matching network 466. An RF input 402 may be connected to an output of the input stage output matching network 466.

The RF input 402 may be connected to a connected to port 1 of the input directional coupler 410 with port impedance Z0 which is typically 50-Ohm. The isolation port 4 of input directional coupler 410 is terminated with an isolation impedance 406 having a first terminal 408 connected to port 4 of input directional coupler 410 and second terminal connected to ground 404. The isolation impedance 406 has a value of Z0. Port 3 of the input directional coupler 410 may be connected to an input 424-1 of the first interstage matching network 438-1. An output of the interstage matching network 438-1 may be connected to an amplifier input 412-1 of the first transmit amplifier 430-1. Port 2 of the input directional coupler 410 may be connected to an input 424-2 of the second interstage matching network 438-2. An output of the second interstage matching network 438-2 may be connected to an amplifier input 412-2 of the second transmit amplifier 430-2.

The amplifier outputs 414-1, 414-2 of the respective transmit amplifiers 430-1, 430-2 may be connected to an input of the respective first and second output matching network 444-1, 444-2. The outputs 432-1, 432-2 of the first and second output matching network 444-1, 444-2 may be connected respectively to ports 2 and 3 of the output directional coupler 420. Port 1 of the output directional coupler 420 may be connected to an antenna terminal 418. The antenna terminal 418 may be connected to an input of an antenna matching network 440. An output of the antenna matching network 460 may be connected to an antenna 442. Port 4 of the output directional coupler 420 may be connected to a receiver amplifier input 422 of a receive amplifier 424. A receiver amplifier output 426 may be connected to the input SPDT switch 434. An input 468 of an input stage matching network 446 may be connected to the input SPDT switch.

In transmit mode, the transmit power amplifiers 430-1, 430-2 may be enabled, and the input SPDT switch 434 connects the RF terminal 432 to the RF input 402 via the input stage input matching network 446, the buffer amplifier 462, and the input stage output matching network 466. An RF signal present on the RF terminal 432 is provided to the RF input 402 and then split in 0° and 90° signals at the transmitter amplifier inputs 412-2, 412-1 respectively for 0° and 90° branches. The amplifier outputs 414-1, 414-2 are connected via output matching networks 444-1,444-2 respectively to ports 2 and 3 of the output directional coupler 420. The output directional coupler 420 combines the 0° and 90° outputs from the transmitter amplifiers 430-1,430-2 and delivers the output signal to port 1 of the output directional coupler 420 which is connected to the antenna terminal 418.

In receive mode, the transmit power amplifiers 430-1, 430-2 are disabled which may result in ports 2 and 3 of the output directional coupler 420 having a high reflective power and the input SPDT switch 434 connects the RF terminal 432 to the receiver amplifier output 426. A signal received on the antenna terminal 418 may be coupled by the output directional coupler 420 to the receiver amplifier input 422 because of the high reflective power of ports 2 and 3 of the output directional coupler 420 due to the high reflection impedance presented at the outputs 432-1, 432-2 of the respective output matching networks 444-1, 444-2. The front end circuit 400 does not require an antenna switch in contrast to front end circuit 200. Instead the output directional coupler 420 is used in both transmit and receive modes to couple the antenna to the appropriate circuitry.

The front end RF circuit architecture 400 may decrease the post-power amplifier insertion loss of the first and second transmit amplifiers 430-1, 430-2 and the pre-LNA insertion loss of the receiver amplifier 424 by omitting the normally-used SPDT switch, and thus may achieve higher efficiency during transmission and a lower noise factor during receive.

The transmit amplifiers 430-1, 430-2 may be a single stage or multi-stage amplifier. In some examples the transmit amplifiers 430-1, 430-2 may be limited to one or two stages for example a single PA output stage, or PA output stage and driver stage. Having a transmit amplifier with one or two stages together with buffer amplifier 462 before the input directional coupler 410 may reduce chip area.

The power management module 470 may provide normal a normal power supply voltage Vcc in transmit (TX) mode and 0-V supply in receive (RX) mode. In RX mode, with 0-V Vcc supply, the transmit amplifiers 430-1, 430-2 may be configured as a switch device and provide a RF-short (low-Ohmic) termination at the transmitter amplifier outputs 414-1, 414-2. The transmit amplifier output matching networks 444-1, 444-2 may provide an optimal impedance termination at the transmitter amplifier outputs 414-1, 414-2 to get a full power reflection of the output directional coupler 420 at ports 2 and 3. Hence, the output direction coupler 420 may have relatively low insertion losses from ports 1 to 4 with S41 close to 0 dB. The most of the power of an RF signal received from antenna 442 may then be coupled to the receiver amplifier input 422.

Figure 6:
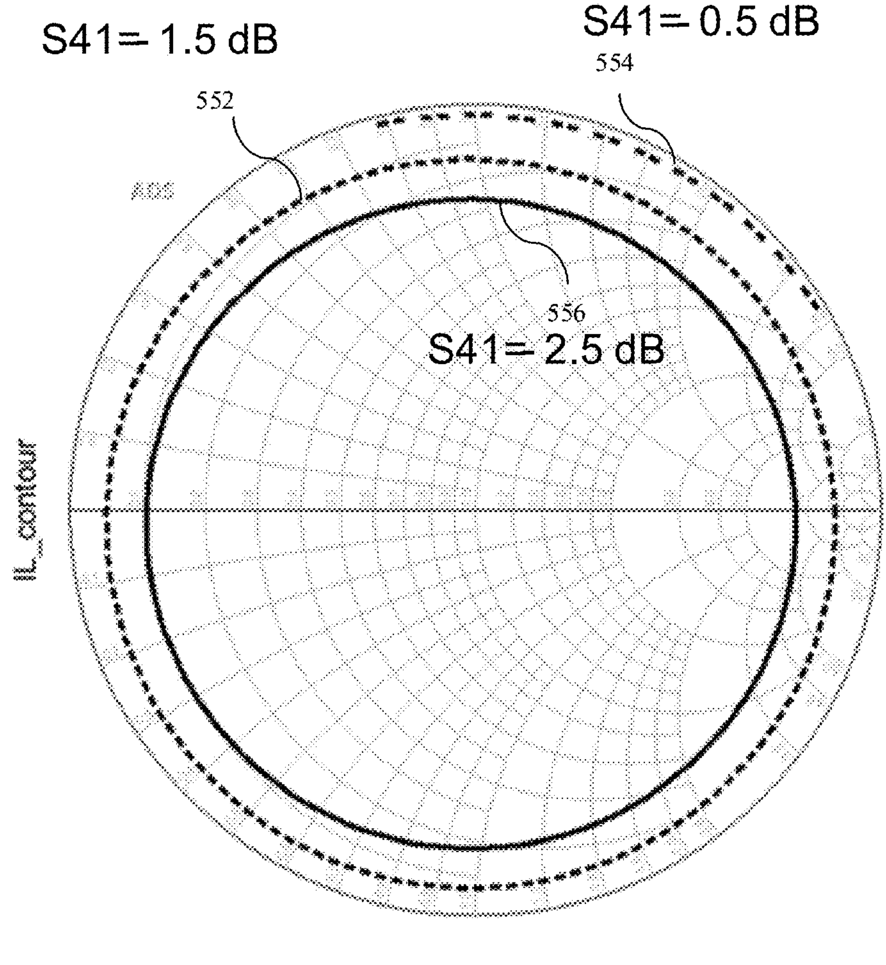
FIG. 6 illustrates a smith chart showing the effect of coupled port impedances on the performance of a directional coupler.

The operation mode of the front end circuit 400 is now described in more detail with reference to FIGS. 6, 7A and 7B. FIG. 6 shows a Smith Chart 500 illustrating the effect of the impedance at port 2 and port 3 on the insertion loss between port 4 and port 1 (S41) of the output directional coupler 420 during receive mode. This impedance may be determined by the output impedance of transmitter amplifiers 430-1, 430-2 in receive mode and the impedance transmit amplifier output matching networks 444-1, 444-2 in receive mode.

Smith Chart 550 shows the result of simulation of an example of a directional coupler which may implement for example the output directional coupler 420 with characteristic impedance Z0=38 Ohm.

The port impedance of ports 1 and 4 of the output directional coupler 420 are set to Z0, and the port impedance of ports 2 and 3 are set to the value Zs. Smith chart 550 shows the result of a sweep of values of Zs over the whole Smith Chart to see the impact of Zs on S41. Solid line 556 refers to the Zs circle giving S41=−2.5 dB. Dotted lines 552 and Dashed lines 554 refer to S41 of −1.5 and −0.5 dB, respectively.

The loss due to coupling between ports 1 and 4 (S41) improves when Zs moves towards the boundary of Smith Chart.

By providing a high-Q termination with high reflection coefficient at ports 2 and 3 of directional coupler in RX mode, the output directional coupler 420 may replace a switch in a front end RF circuit with reduced insertion losses.

Figure 7A:
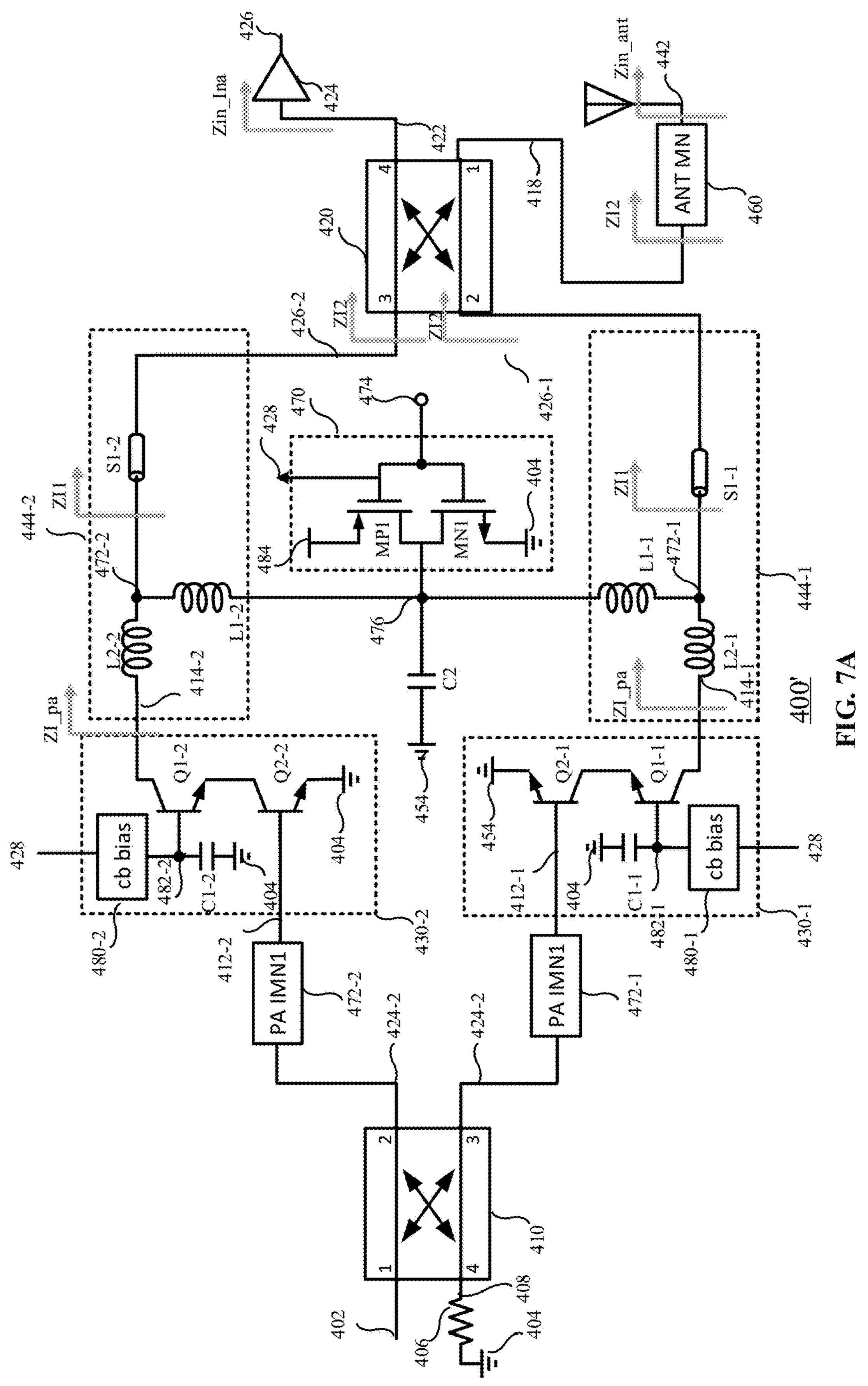
FIGS. 7A and 7B illustrates an RF circuit according to an embodiment showing the impedances in transmit and receive mode.
Figure 7B:
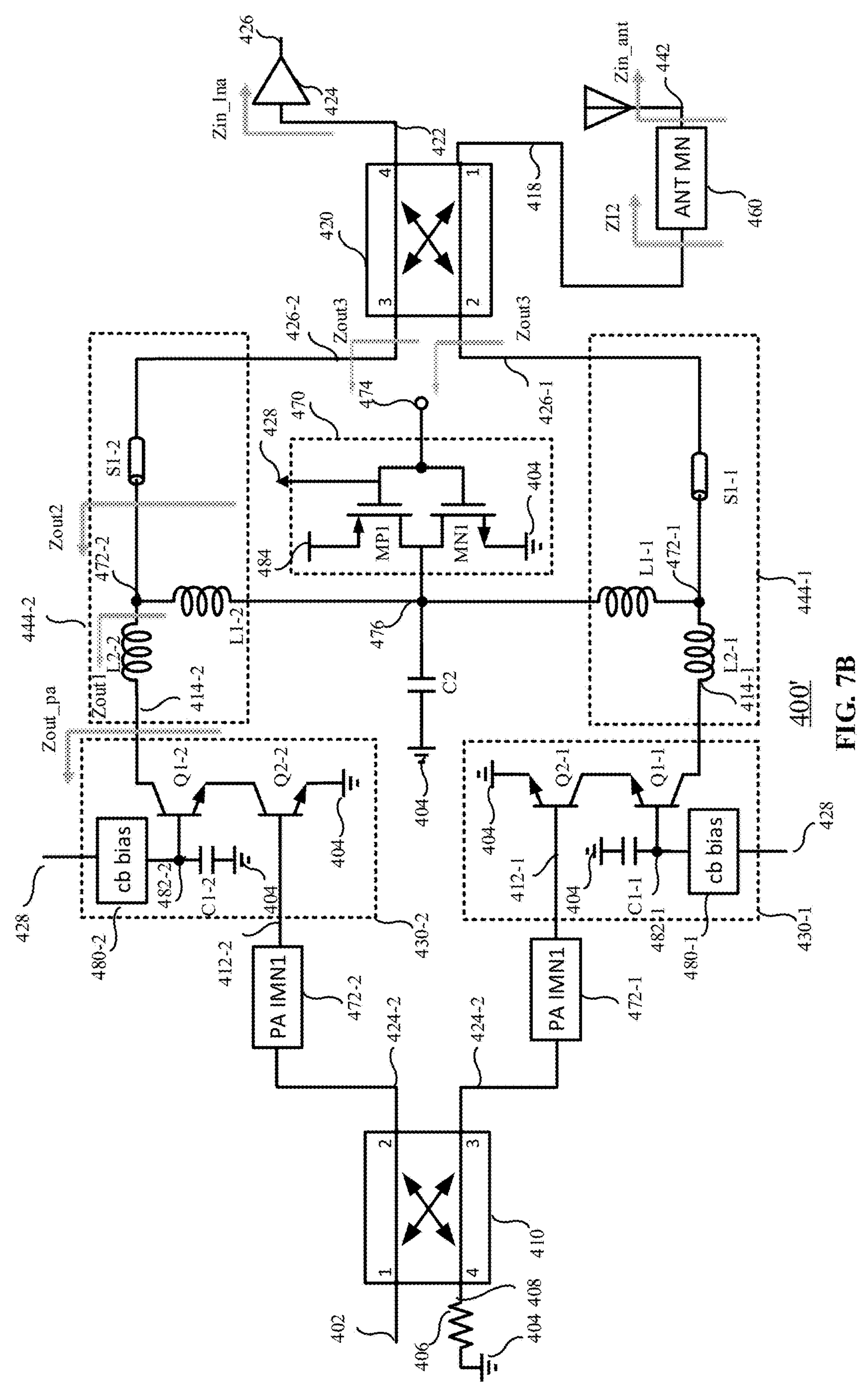

FIG. 7A and FIG. 7B shows RF front end circuit 400' including an example implementation of power management module 470, transmitter amplifiers 430-1, 430-2 and transmitter amplifier output matching networks 441-1, 444-2. It will be appreciated that other implementations of power management module 470, transmitter amplifiers 430-1, 430-2 and transmitter amplifier output matching networks 441-1, 444-2 may be used. In some examples power management module 470 may be omitted. FIG. 7A illustrates the RF front end circuit 400' impedances in receive mode and FIG. 7B shows RF front end circuit 400' impedances in transmit mode. Power management module 470 may include an inverter formed with PMOS transistor MP1 and NMOS transistor MN1. An input 474 of the power management module may be connected to the gates of PMOS transistor MP1 and NMOS transistor MN1. A voltage supply rail 484 may be connected to the source of PMOS transistor P1. The source of NMOS transistor MN1 may be connected to ground 404. The inverter output i.e. drains of transistors MP1 and MN1 may be connected to the second power management output 476.

A capacitor C2 may have a first terminal connected to mode control input and a second terminal connected to ground 404. The transmitter amplifier output matching networks 441-1, 444-2 include a respective first inductor L1-1, L1-2 which may be referred to as a shunt inductor connected between the mode control input and a respective common node 472-1, 472-2. The output matching networks 441-1, 444-2 further include a respective second inductor L2-1. L2-2 having a respective first terminal connected to corresponding transmitter amplifier output 414-1, 414-2 and a respective second terminal connected to the respective common node 472-1, 472-2. The respective second inductor L2-1, L2-2 may be referred to as a series inductor. A transmission line S1-1, S1-2 has a respective first terminal connected to the respective common node 472-1, 472-2 and a respective second terminal connected to the output 426-1, 426-2 of the output matching networks 441-1, 444-2. In some examples the second inductors L2-1, L2-2 and transmission lines S1-1, S1-2 may be omitted.

As illustrated, transmitter amplifiers 430-1, 430-2 may include a NPN cascode stage consisting of respective first NPN transistor Q1-1, Q1-2 configured as a common-base transistor and respective second NPN transistor Q2-1, Q2-2 configured as a common-emitter transistor. A capacitor C1-1, C1-2 is connected between the base 482-1, 482-2 of the first NPN transistor Q1-1, Q1-2 and ground 404. The transmitter amplifier input 412-1, 412-2 is connected to the base of the respective second NPN transistor Q2-1, Q2-2. The transmitter amplifier output 414-1, 414-2 is connected to the collector of the respective first NPN transistor Q1-1, Q1-2. The respective emitters of the first NPN transistor Q1-1, Q1-2 are connected to the respective collectors of the second NPN transistor Q2-1, Q2-2. The respective emitters of second NPN transistor Q2-1, Q2-2 are connected to ground (404) but in other examples may be connected to a different reference voltage supply. A common base bias circuit 480-1, 480-2 has a control input connected to the first power management output 428 and an output connected to the base 482-1, 482-2 of the respective first NPN transistor Q1-1, Q1-2.

Referring now to FIG. 7A, in TX mode, the input control voltage of 0 Volts may be applied to the power management control input 474. This may correspond to a logic low control value. The inverter delivers an output supply voltage of Vcc at first power management output 428 which may correspond to a logic high control value. The antenna matching network 460 is used to transform the antenna impedance denoted Zin_ant to the characteristic impedance of the output directional coupler 420 denoted Zl2. The transmission lines S1-1, S1-2 may be have the same characteristic impedance as the output directional coupler 420, thus the impedance at the common node 472-1, 472-2 denoted Zl1=Zl2. The transmission lines S1-1. S1-2 do not have any functionality for TX mode, First inductor L1-1, L1-2 and second inductors L2-1, L2-2 may transform impedance Zl1 to an optimal loading impedance of the transmit amplifiers 430-1, 430-2 denoted Zl_pa. The common base bias circuit 480-1, 480-2 may provide a typical bias voltage of around 1.5-V in TX mode.

Hence, in TX mode the power management module 470 provides a voltage supply, and output matching networks 444-1,444-2 provide optimal load impedance for the respective transmitter amplifiers 430-1, 430-2.

Turning now to FIG. 7B, in RX mode, the input control voltage of inverter is 0V may be applied to the power management control input 474 and the inverter output is 0 volts or ground at first power management output 428. The common base bias circuit 480-1, 480-2 may also change the bias voltage to around 0.8 V. Thus, the base-to-collector junction (PN junction) of the first transistor Q1-1, Q1-2 is forward-biased and becomes a RF short (low-Ohmic) connection. The bias current will flow from the common base bias circuit 480-1, 480-2 through the base and collector of the respective first transistor Q1-1, Q1-2, and finally through the inverter NMOS transistor MN1 to ground. In this way, the first transistor Q1-1 is biased in saturation mode and used as a shunt switch in RX mode. In other examples, a MOS-based transmit amplifier may be used by replacing common-base transistor Q1-1 with a common gate NMOS transistor and common-emitter transistor Q2-1 with a common source NMOS transistor and biasing appropriately.

In other examples, other bipolar or MOS based amplifier configurations may be used which are configured to provide a high reflection impedance at port 2 and port 3 of the output directional couplers 320, 420 in a receive mode. This may be done for example for example by providing a short a circuit, an open circuit, an inductive impedance, a capacitive impedance or other implementation that supports the high reflection at Zout3 which should be near to the boundary of the Smith Chart 500

For an example 45-GHz RF system, in RX mode, the first transistors Q1-1, Q1-2 are turned on. Due to the transistor on-resistance and the limited decoupling capacitor C1-1. C1-2, the output impedance may be Zout_pa=1.8−j*1.4. The second inductor L2-1, L2-2 may tune out the imaginary part of the Zout_pa, and maximize the reflection coefficient. The first inductor L1-1, L1-2 is mainly for TX mode and has marginal impact on the output impedance Zout1 (Zout2≈Zout1). The series transmission line S1-1, S1-2 may transform the impedance from Zout2 to Zout3. This may rotate the phase of reflection coefficient, in order to create the optimal power reflection at the ports P3 and P2 of directional coupler 420. This may minimize the insertion loss from Ports 4 to 1. Similarly to the TX mode, in RX mode the antenna matching network 460 transforms Zin_ant to Zl2. Since the insertion loss from Ports 4 to 1 in the directional coupler 420 is minimized, the signal received at antenna 442 will travel from ports 1 to 4, and consequently to the input of the receiver amplifier 424. The required input impedance Zin_lna of the receiver amplifier 424 is the same as TX mode, and consequently no extra RF switches are required at the receiver amplifier input 422.

Hence, in RX mode, power management module 470 provides a 0-V supply, and output matching networks 444-1, 444-2 provide optimal termination for the output directional coupler 420.

Figure 7C:
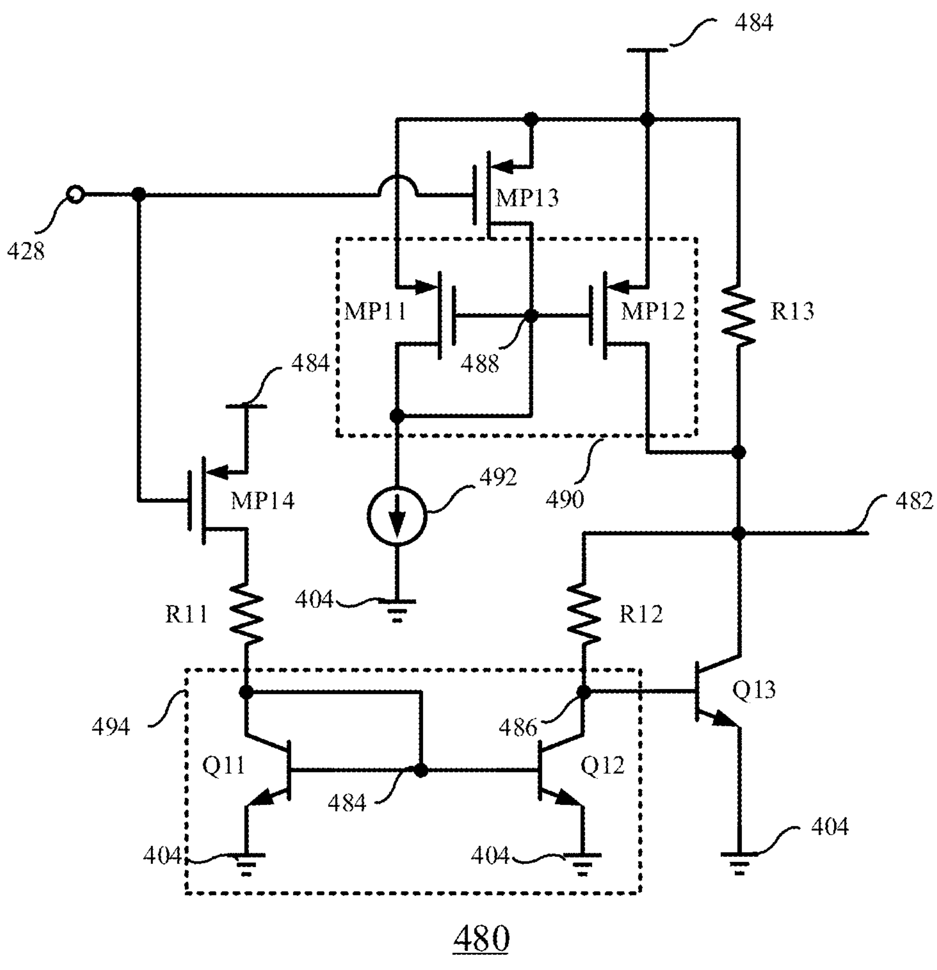
FIG. 7C shows an example implementation of a bias circuit for the transmit amplifiers shown in FIGS. 7A and 7B.

FIG. 7C shows an example implementation of a common base bias circuit 480. The common base bias circuit 480 has a control input which may be connected to the first power management output 428 and to the gates of PMOS transistors MP13, MP14. A first current mirror 490 includes a current mirror pair of PMOS transistors MP11, MP12 which have gates connected to node 488. Node 488 is also connected to the drains of PMOS transistor MP11, MP13 and a first terminal of current reference 492. A second terminal of current reference 492 is connected to ground 404. The sources of PMOS transistors MP11, MP12, MP13, MP14 and a first terminal of resistor R13 are connected to the voltage supply rail 484. The bias circuit output 482 is connected to the drain of PMOS transistor MP12, a second terminal of resistor R13, a first terminal of resistor R12 and the collector of NPN transistor Q13.

NPN transistor Q13 and resistor R12 form a gyrator. A second current mirror 494 includes NPN transistors Q11 and Q12. Node 486 is connected to the base of transistor Q13, the collector of transistor Q12 and a second terminal of resistor R12. Voltage supply rail 484 is connected to the bases of transistors Q11, Q12, the collector of transistor Q11 and a first terminal of resistor R11. A second terminal of resistor R11 is connected to the drain of PMOS transistor MP14. The emitters of NPN transistors Q11, Q12, Q13 are connected to ground 404.

In TX mode the power management module 470 may provide 0V on first power management output 428 and PMOS transistors MP13 and MP14 are turned on. The first current mirror 490 including the current mirror pair of transistors MP11, MP12 which are programmed by current reference 492 are turned off since the gate voltage is pulled up to supply voltage (Vcc). Hence, the bias voltage at the bias circuit output 482 is determined by the gyrator including NPN transistor Q13 and resistor R12. The second current mirror 494 includes NPN transistors Q11 and Q12 with reference current programmed by resistor R11 provides the bias current for resistor R12. The bias voltage at the bias circuit output 482 equals the voltage drop across resistor R12 and base-to-emitter voltage of NPN transistor Q13. The bias voltage may be controlled by adjusting the bias current of resistor R12.

In RX mode, the power management module 470 may provide Vcc on first power management output 428 and PMOS transistors MP13 and MP14 are turned off. As there is no bias current, the second current mirror 494 and the gyrator including NPN transistor Q13 and resistor R12 are also effectively turned off. Since PMOS transistor MP13 is turned off, the first current mirror 490 is enabled and provides the current bias at bias circuit output 482. The collector of transistors Q1-1, Q1-2 is pulled down to 0V, and the voltage at bias circuit output 482 provides the bias current to turn on the base-to-collector PN junction of transistors Q1-1. Q1-2 which provide a RF short (low-Ohmic) connection.

FIG. 8A shows a CMOS totem-pole amplifier 500 and output matching network 520 that may be used to implement transmit amplifiers 330, 430. CMOS totem-pole amplifier 500 may not require a separate power management module 470. CMOS totem-pole amplifier 500 includes PMOS transistor MP21, NMOS transistor MN21, associated bias circuits 508, 512 and decoupling capacitors C21, C22. The source of the PMOS transistor MP21 may be connected to supply voltage node 506. The PMOS bias output 510 of the PMOS bias circuit 508 may be connected to the gate of PMOS transistor MP21. The source of the NMOS transistor MN21 may be connected to ground 504. The NMOS bias output 516 of the PMOS bias circuit 512 may be connected to the gate of NMOS transistor MP21. The drains of the MOS transistors MN21, MP21 are connected to the transmitter amplifier output 514. Decoupling capacitors C21, C22 may be connected between the transmitter amplifier input 502 and the respective gates of MOS transistors MN21, MP21. The output matching network 520 may include a series arrangement of inductor L21 and capacitor C23 between the transmit amplifier output 514 and the output 518 of the output matching network 520.

FIG. 8B shows the bias voltages provided by the PMOS bias circuit 508 and NMOS bias circuit 512 in TX mode. A bias gate source voltage Vgs is provided by the NMOS bias circuit 512 and a voltage Vdd-Vgs is provided by PMOS bias circuit 508 where Vdd is the supply voltage. This may bias the transmit amplifier output 514 at Vdd/2. FIG. 8C shows the bias voltages provided by the PMOS bias circuit 508 and NMOS bias circuit 512 in RX mode. A bias voltage Vdd is provided by the NMOS bias circuit 512 and PMOS bias circuit 508. The PMOS transistor MP21 is then turned off effectively disabling the amplifier. The NMOS transistor MN21 is turned on and effectively acts as a shunt switch to ground.

Figure 9A:
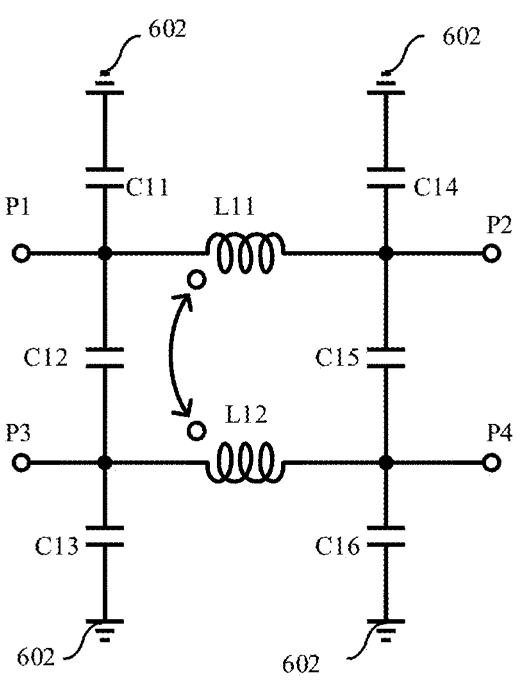
FIG. 9A shows a lumped circuit model of a coupler.

FIG. 9A shows a lumped model 600 of a four port coupler equivalent to couplers 110,120. Capacitor C11 is connected between port P1 and ground 602. Capacitor C12 is connected between port P1 and port P3. Capacitor C13 is connected between port P3 and ground 602. Inductor L11 is connected between ports P1 and P2. Inductor L12 is connected between ports P3 and P4. Capacitor C14 is connected between port P2 and ground 602. Capacitor C15 is connected between port P2 and port P4. Capacitor C16 is connected between port P4 and ground 602. Capacitors C12. C15 may have a first capacitance value C1. Capacitors C11, C13, C14, C16 may have a second capacitance value C2. Inductors L11, L12 have an inductance value L. For a standard coupled-line based directional coupler, the equations for the lumped components are $$L = \frac{\sqrt{2}Z_0}{2\pi f_c},\ K = \frac{\sqrt{2}}{2},\ C1 = \frac{1}{2\pi f_c Z_0},\ C2 = \frac{\sqrt{2}-1}{2\pi f_c Z_0},$$

where Z0 is the characteristic impedance (also the port impedance) typically set to Z0=50-Ohm, fc is the centre operation frequency. K is the coupling factor between inductors L11, L12

Taking fc=45 GHz as an example and a Q-factor of 15 for the series inductance L11. L12, and select the values of L, C1 and C2 for RF performance including return loss, isolation, phase and amplitude imbalance.

Figure 9B:
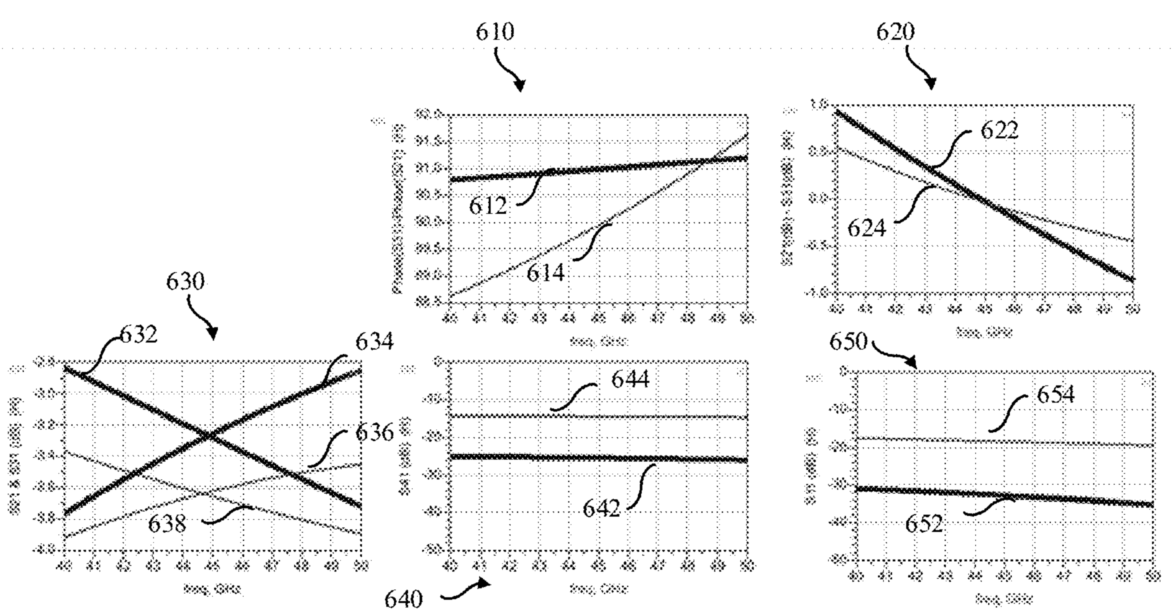
FIG. 9B shows the relative performance of couplers with two different coupling factors.

FIG. 9B shows graphs 610,620,630,640,650 of variation in different s-parameters in the y-axis versus frequency ranging between 40 and 50 GHz on the x-axis. Graph 610 shows the phase imbalance between S31 and S21 on the y-axis varying between 88.5 and 92.0 versus frequency. Graph 620 shows the amplitude imbalance between S31 and S21 on the y-axis varying between −1.0 to +1.0 dB versus frequency. Graph 630 shows the insertion loss and coupling of S31 and S21 on the y-axis varying between −4.0 to −2.8 dB versus frequency. Graph 640 shows the isolation S41 on the y-axis varying between −50 dB to 0 dB versus frequency. Graph 650 shows the return loss S11 on the y-axis varying between −50 dB to 0 dB versus frequency.

The graphs 610,620,630,640,650 compare the performance between K value of √2/2 shown by lines 614,624, 636,638,644, 654 and a K value of 0.9 shown by lines 612, 622, 632,634, 642, 652 respectively. A higher coupling factor has lower insertion loss, better phase balance, isolation (S41) and matching (S11), although a higher coupling factor brings more amplitude imbalance between the insertion loss (S21) and coupling (S31). However, since the phase imbalance with high coupling factor is good, the amplitude imbalance may be compensated by an asymmetric connection of the input directional couplers and the output directional couplers via the transmit amplifiers in embodiments of the RF circuit. For example, for RF front-end circuit 300 port 2 of the input directional coupler 310 is connected via the transmit amplifier 330-2 to port 3 of the output directional coupler 320 and port 3 of the input directional coupler 310 is connected via the transmit amplifier 330-1 to port 1 of the output directional coupler 320.

FIGS. 10A to 10G illustrate different views of a directional coupler 700 according to an embodiment. Directional coupler 700 may be used to implement input directional couplers 110, 310, 410 and output directional couplers 120,320,420. FIG. 10A shows a coupling-enhanced coupled-line based directional coupler 700. FIG. 10B shows line 12 in the coupler. Line 12 include a first metal segment 702 implemented in a first metal layer MT1 and a second metal segment 704 implemented in a second metal layer MT2. FIG. 10C shows line 34 in the coupler. Line 34 include a third metal segment 708 implemented in the first metal layer MT1 and a second metal segment 706 implemented in a second metal layer MT2. FIGS. 10D, 10E, 10F shows 3D views of the directional coupler corresponding respectively FIGS. 10A, 10B, 10C.

As shown in FIG. 10B, the line 12 from P1 to P2 is split into two lines in parallel: segment 702 in MT1 and segment 704 in MT2, respectively. Similarly, line 34 from P3 to P4 is split into two lines in parallel: segment 706 in MT2 and segment 708 in MT1.

Since segment 702 is under segment 706 and next to segment 708, this may allow magnetic and/or capacitive coupling between segments 702 and 706, and between segments 702 and 708. Similarly, since segment 704 is on top of segment 708 and next to segment 706 this may allow magnetic and/or capacitive coupling between segments 704 and 708, and between segments 704 and 706. Thus, in total there are four magnetic and capacitive coupling paths in the directional coupler 700.

FIG. 10G shows a cross-section of directional coupler 700 to illustrate the paths of magnetic coupling and capacitive coupling. Since segments 702 and 704 are in the parallel connection, they have the same potential and therefore have no capacitive or magnetic coupling in between. Similarly since segments 706 and 708 are in the parallel connection, they have the same potential and therefore have no capacitive or magnetic coupling between them. The directional coupler 700 may have a higher coupling factor K, for example K=0.9, than a conventional coupler. The directional coupler may implement couplers 310,320, 410, 420 which, together with the asymmetric connection described above may reduce losses in TX and RX modes of operation.

Embodiments of the RF circuit using a balanced power amplifier may be included in a front-end integrated circuit as part mobile communication systems, radar systems or other RF systems. Embodiments of the RF circuit may allow the removal of 1 or more switches normally required to change between transmit and receive mode of operation to couple the appropriate signal path to an antenna. As a result, by removing physical switches, post-PA (transmit amplifier) and pre-LNA (receive amplifier) losses may be reduced. This may improve transmitter efficiency and receiver noise. Illustrated embodiments show an RF circuit for connecting to an antenna via an antenna terminal for wireless communication. Other examples of the RF circuit may have an input-output terminal for wired communication instead of an antenna terminal. The input-output terminal may be connected to further circuitry by a wired connection for wired RF communication. In other examples, the RF circuit may be included in optical communication systems with appropriate interfacing circuitry connected to the input-output terminal.

A Radio-Frequency (RF) circuit for an RF front-end is described. The RF circuit includes a balanced amplifier which is configured in transmit mode to transmit an RF signal to an antenna. One port of the output directional coupler of the balanced amplifier is coupled to an input of a receiver amplifier. In a receive mode, the output directional coupler of the balanced amplifier may couple a signal received from an antenna to the input of the receiver amplifier. Using a coupler instead of a conventional switch when changing between transmit and receive modes may reduce insertion losses.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A radio frequency (RF) circuit for an RF front-end, the RF circuit comprising:
- an input-output terminal configured to be coupled to an antenna;
- a receiver amplifier with an input and an output;
- a balanced amplifier that includes
  - an input directional coupler comprising first, second, third, and fourth ports,
  - an output directional coupler comprising first, second, third, and fourth ports,
  - a first transmit amplifier, and
  - a second transmit amplifier,
- wherein
  - an input of the first transmit amplifier is coupled to the third port of the input directional coupler,
  - an input of the second transmit amplifier is coupled to the second port of the input directional coupler,
  - the first port of the output directional coupler is coupled to the input-output terminal, the second port of the output directional coupler is coupled to an output of the first transmit amplifier, the third port of the output directional coupler is coupled to an output of the second transmit amplifier, and the fourth port of the output directional coupler is coupled to the input of the receiver amplifier, and
  - the RF circuit is configured in a transmit mode of operation to transmit an RF signal to the input-output terminal and in a receive mode of operation to couple an RF signal received on the first port of the output directional coupler to an input of the receiver amplifier; and
- a power management module coupled to the first transmit amplifier and to the second transmit amplifier, wherein the power management module is configured, in the transmit mode of operation, to enable the first transmit amplifier and the second transmit amplifier, and, in the receive mode of operation, to configure the first transmit amplifier and second transmit amplifier to provide a high reflection power.

2. The RF circuit of claim 1, wherein the input-output terminal comprises an antenna terminal.

3. The RF circuit of claim 1, wherein the balanced amplifier further comprises:
- a first output matching network arranged between the output of the first transmit amplifier and the second port of the output directional coupler; and
- a second output matching network arranged between the output of the second transmit amplifier and the third port of the output directional coupler.

4. A radio frequency (RF) circuit for an RF front-end, the RF circuit comprising:
- an input-output terminal configured to be coupled to an antenna;
- a receiver amplifier with an input and an output;
- a balanced amplifier that includes
  - an input directional coupler comprising first, second, third, and fourth ports,
  - an output directional coupler comprising first, second, third, and fourth ports, wherein the first port of the output directional coupler is coupled to the input-output terminal, and the fourth port of the output directional coupler is coupled to the input of the receiver amplifier,
  - a first transmit amplifier, wherein an input of the first transmit amplifier is coupled to the third port of the input directional coupler, and the second port of the output directional coupler is coupled to an output of the first transmit amplifier,
  - a second transmit amplifier, wherein an input of the second transmit amplifier is coupled to the second port of the input directional coupler, and the third port of the output directional coupler is coupled to an output of the second transmit amplifier, a first output matching network arranged between the output of the first transmit amplifier and the second port of the output directional coupler, wherein the first output matching network includes a first inductor having a first inductor first terminal coupled to the output of the first transmit amplifier and a first inductor second terminal configured to be coupled to a supply voltage in the transmit mode of operation and to a ground in the receive mode of operation, and a second output matching network arranged between the output of the second transmit amplifier and the third port of the output directional coupler, wherein the second output matching network includes a second inductor having a second inductor first terminal coupled to the output of the second transmit amplifier and a second inductor second terminal configured to be coupled to the supply voltage in the transmit mode of operation and to the ground in the receive mode of operation, and wherein the RF circuit is configured in a transmit mode of operation to transmit an RF signal to the input-output terminal and in a receive mode of operation to couple an RF signal received on the first port of the output directional coupler to an input of the receiver amplifier.

5. The RF circuit of claim 4, further comprising:

a power management module coupled to the first transmit amplifier and to the second transmit amplifier, wherein the power management module is configured, in the transmit mode of operation, to enable the first transmit amplifier and the second transmit amplifier, and, in the receive mode of operation, to configure the first transmit amplifier and second transmit amplifier to provide a high reflection power.

6. The RF circuit of claim 4, wherein:

the power management module further comprises an inverter having an inverter input and an inverter output;

the inverter output is coupled to the first inductor second terminal and to the second inductor second terminal; and the inverter input is configured to receive a logic low control value in the transmit mode of operation and logic high control value in the receive mode of operation.

7. The RF circuit of claim 3, wherein:

the first output matching network includes a first series arrangement of a first inductor and a first transmission line between the output of the first transmit amplifier and the second port of the output directional coupler, wherein a first inductor first terminal is coupled to the output of the first transmit amplifier, and a first inductor second terminal is coupled to a common node of the series arrangement of the first inductor and the first transmission line; and the second output matching network includes a second series arrangement of a second inductor and a second transmission line between the output of the second transmit amplifier and the third port of the output directional coupler, wherein a second inductor first terminal is coupled to the output of the second transmit amplifier, and a second inductor second terminal is coupled to a common node of the series arrangement of the second inductor and the second transmission line.

8. The RF circuit of claim 1, wherein:

a fourth port of the input directional coupler is configured to be coupled to an isolation impedance.

9. A radio frequency (RF) circuit for an RF front-end, the RF circuit comprising:

an input-output terminal configured to be coupled to an antenna;

an RF terminal;

a receiver amplifier with an input and an output; and a balanced amplifier that includes an input directional coupler comprising first, second, third, and fourth ports, wherein the fourth port of the input directional coupler is configured to be coupled to an isolation impedance, an output directional coupler comprising first, second, third, and fourth ports, a first transmit amplifier, and a second transmit amplifier, wherein an input of the first transmit amplifier is coupled to the third port of the input directional coupler, an input of the second transmit amplifier is coupled to the second port of the input directional coupler, the first port of the output directional coupler is coupled to the input-output terminal, the second port of the output directional coupler is coupled to an output of the first transmit amplifier, the third port of the output directional coupler is coupled to an output of the second transmit amplifier, and the fourth port of the output directional coupler is coupled to the input of the receiver amplifier, the RF circuit is configured in a transmit mode of operation to transmit an RF signal to the input-output terminal and in a receive mode of operation to couple an RF signal received on the first port of the output directional coupler to an input of the receiver amplifier, and the RF circuit is further configured in the transmit mode to switchably couple the input of the balanced amplifier to the RF terminal, and in the receive mode to switchably couple the output of the receiver amplifier to the RF terminal.

10. The RF circuit of claim 9, wherein the balanced amplifier further comprises:

a first interstage matching network arranged between the input of the first transmit amplifier and the third port of the input directional coupler; and a second interstage matching network arranged between the input of the second transmit amplifier and the second port of the input directional coupler.

11. The RF circuit of claim 10, further comprising:

a first shunt switch coupled between the input of the first transmit amplifier and ground; and a second shunt switch coupled between the input of the second transmit amplifier and ground, and wherein in the receive mode of operation, the balanced amplifier is further configured to switchably couple the input of the first transmit amplifier and the input of the second transmit amplifier to ground, and to output a received RF signal from the output of the receiver amplifier to the RF terminal, and in the transmit mode of operation, the RF circuit is configured to receive an RF signal for transmission on the RF terminal.

12. The RF circuit of claim 11, further comprising:
a bidirectional amplifier coupled between the RF terminal and the first port of the input directional coupler.

13. The RF circuit of claim 9, further comprising:
a switch having a first switch terminal coupled to the RF terminal, a second switch terminal coupled to the first port of the input directional coupler, and third switch terminal coupled to the receiver amplifier output; and
a transmit buffer amplifier arranged between the second switch terminal and the first port of the input directional coupler, and configured, in the receive mode of operation, to couple the receiver amplifier output to the RF terminal in the receive mode of operation, and configured, in the transmit mode of operation, to couple the first port of the input directional coupler to the RF terminal.

14. The RF circuit of claim 1, wherein:
a first port of the input directional coupler is configured to be coupled to an RF terminal of the RF circuit; and
a fourth port of the input directional coupler is coupled to the output of the receiver amplifier.

15. The RF circuit of claim 1, wherein:
the first transmit amplifier includes
a first cascode arrangement of a first bipolar transistor in a common base configuration, and a second bipolar transistor in a common emitter configuration, wherein a base of the second bipolar transistor is coupled to the input of the first transmit amplifier, an emitter of the second bipolar transistor is coupled to a first reference voltage, a collector of the first bipolar transistor is coupled to the output of the first transmit amplifier, and the base of the first bipolar transistor is coupled to a first bias circuit, and
a first capacitor coupled between the base of the first bipolar transistor and a ground;
the second transmit amplifier includes
a second cascode arrangement of a third bipolar transistor in the common base configuration, and a fourth bipolar transistor in the common emitter configuration, wherein a base of the fourth bipolar transistor is coupled to the input of the second transmit amplifier, an emitter of the fourth bipolar transistor is coupled to a second reference voltage, a collector of the third bipolar transistor is coupled to the output of the second transmit amplifier, and the base of the third bipolar transistor is coupled to a second bias circuit, and
a second capacitor coupled between the base of the third bipolar transistor and the ground; and
wherein
in the transmit mode of operation, the output of the first transmit amplifier and the output of the second transmit amplifier are configured to be coupled to a supply voltage, and
in the receive mode of operation, the output of the first transmit amplifier and the output of the second transmit amplifier are configured to be coupled to a reference voltage, the first bias circuit is configured to forward bias the base-collector junction of the first bipolar transistor, and the second bias circuit is configured to forward bias the base-collector junction of the third bipolar transistor.

16. The RF circuit of claim 15, wherein the first bias circuit comprises:
a gyrator including a fifth bipolar transistor having a collector coupled to the base of the first bipolar transistor;
a first current mirror coupled to the gyrator; and
a second current mirror coupled to the base of the first bipolar transistor, and
wherein
in the transmit mode of operation, the first current mirror is disabled, the second current mirror is enabled and the first bias circuit is configured to bias the gyrator to provide the bias current to the first bipolar transistor, and
in the receive mode of operation, the first current mirror is enabled, the second current mirror is disabled and configured to provide the bias current to the first bipolar transistor.

17. The RF circuit of claim 1, wherein the output directional coupler and the input directional coupler comprise a directional coupler comprising:
a first metal layer that includes
a first metal line configured to be electrically coupled to the first port of the directional coupler and the second port of the directional coupler, and
a second metal line configured to be electrically coupled to the third port of the output directional coupler and the fourth port of the directional coupler, wherein a segment of the first metal line is parallel to the second metal line; and
a second metal layer arranged above the first metal layer that includes
a third metal line configured to be electrically coupled to the first port of the directional coupler and the second port of the directional coupler, and
a fourth metal line configured to be electrically coupled to the third port of the output directional coupler and the fourth port of the directional coupler, wherein a segment of the third metal line is parallel to the fourth metal line.

18. The RF circuit of claim 17, wherein:
the segment of the first metal line is parallel to and directly below the fourth metal line; and
the segment of the second metal line is parallel to and directly below the third metal line.

19. The RF circuit of claim 1, further comprising:
an antenna coupled to the first port of the output directional coupler; and
an antenna matching network arranged between the first port of the output directional coupler and the antenna.

20. The RF circuit of claim 1, wherein each of the first transmit amplifier and the second transmit amplifier further comprises a CMOS totem-pole amplifier wherein the output of the CMOS totem-pole amplifier is configured to be biased at half the supply voltage in transmit mode and at a ground voltage in receive mode.

* * * * *